United States Patent [19]

Tait et al.

[11] Patent Number: 4,555,291

[45] Date of Patent: Nov. 26, 1985

[54] METHOD OF CONSTRUCTING AN LC NETWORK

[75] Inventors: William C. Tait; Lanny L. Harklau, both of Saint Paul, Minn.

[73] Assignee: Minnesota Mining and Manufacturing Company, St. Paul, Minn.

[21] Appl. No.: 611,093

[22] Filed: May 17, 1984

Related U.S. Application Data

[62] Division of Ser. No. 256,934, Apr. 23, 1981, abandoned.

[51] Int. Cl.$^4$ .................. H03H 1/00; H03H 3/00; H03H 7/01
[52] U.S. Cl. .................... 156/250; 156/263; 156/267; 333/138; 333/140; 333/175; 333/185; 336/200; 336/205; 336/232
[58] Field of Search ............ 156/250, 263, 264, 267; 333/138, 140, 175, 185; 336/69, 200, 205, 208, 232

[56] References Cited

U.S. PATENT DOCUMENTS

| | | | |
|---|---|---|---|
| 3,089,106 | 5/1963 | Saaty | 336/200 |
| 3,301,730 | 1/1967 | Spiwak et al. | 156/267 |
| 3,413,716 | 12/1968 | Schwertz et al. | 29/602 |
| 3,419,834 | 12/1968 | McKechnie | 336/69 |
| 3,497,410 | 2/1970 | Zagusta et al. | 156/233 |
| 3,504,276 | 3/1970 | Proctor et al. | 324/37 |
| 3,536,545 | 10/1970 | Traynor et al. | 156/3 |
| 3,547,724 | 12/1970 | Zagusta | 156/233 |
| 3,798,059 | 3/1974 | Astle et al. | 336/200 |
| 3,848,210 | 11/1974 | Felkner | 336/200 |
| 4,021,705 | 5/1977 | Lichtblau | 361/402 |
| 4,313,151 | 1/1982 | Vranken | 361/402 |
| 4,313,152 | 1/1982 | Vranken | 361/402 |
| 4,482,874 | 11/1984 | Rubertus et al. | 156/267 |

FOREIGN PATENT DOCUMENTS 993265 5/1965 United Kingdom ............... 336/200

OTHER PUBLICATIONS

IBM Technical Disclosure Bulletin, "Etched Transformer", D. J. Crawford et al., vol. 8, No. 5, Oct. 1965, p. 723.

Primary Examiner—Caleb Weston
Attorney, Agent, or Firm—Donald M. Sell; James A. Smith; William B. Barte

[57] ABSTRACT

A method of constructing an LC network, and the resulting LC network manufactured by cutting and removing a predetermined pattern from a first and a second conductive sheet, leaving on each sheet a generally coil-like configuration of windings with a sufficient number of interconnections between the adjacent windings to add rigidity to the sheets, laminating these conductive sheets to opposing faces of a non-conductive sheet, thereby forming at least one capacitor, cutting and removing a pre-determined pattern from the lamination eliminating at least some of the interconnections and leaving a conductive path on the conductive sheets which is in the configuration of a coil.

5 Claims, 4 Drawing Figures

METHOD OF CONSTRUCTING AN LC NETWORK

This a division of application Ser. No. 256,934 filed Apr. 23, 1981 now abandoned.

BACKGROUND OF THE INVENTION

Electrical circuits often use inductive and capacitive networks (LC networks) for such functions as creating a time delay for an electrical signal or forming a tank circuit having a specific resonant frequency. Presently, these LC networks are formed by such methods as installing discrete inductors and capacitors; or by etching conductive paths in the shape of inductive coils on an insulating substrate and adding either discrete capacitors or capacitive pads on the same substrate (see for example U.S. Pat. No. 4,021,705), both of which are labor intensive, and therefore costly. Because of the prominence of these LC networks within electrical circuits, it is highly desirable to have a low cost, and yet reliable method of manufacture for these networks.

SUMMARY OF THE INVENTION

The present invention is directed to such a simplified and low-cost method of manufacturing LC networks, and to the LC networks which are manufactured by this method. The method according to the present invention comprises cutting, punching and removing a predetermined pattern from a first conductive sheet, typically a conductive foil. What remains of the conductive sheet after this first cutting operation is a conductive path having an essentially coil-like configuration of windings, with a plurality of interconnections between the adjacent windings which are purposely left by the first cutting operation to add rigidity and thereby cause the conductive sheet to remain planar and essentially self-supporting. A similar cutting and removing operation is also performed on a second conductive sheet resulting in a conductive path having an essentially coil-like configuration, and also having a plurality of interconnections between the adjacent windings wherein the conductive sheet remains intact. The self-supporting nature of these conductive paths facilitates their handling in the next method step, when at least one capacitor is formed by orienting and laminating the first and the second conductive sheets to opposing faces of a non-conductive sheet with at least one portion of the conductive path on the first conductive sheet substantially aligned with at least one portion of the conductive path on the second conductive sheet, but with the aligned portions separated from each other by the non-conductive sheet. With the added strength of the non-conductive sheet within the lamination, at least one inductor can now be formed by cutting and removing a predetermined pattern from the lamination thereby eliminating at least some of the interconnections between the adjacent windings at each of the conductive sheets. What remains is at least two continuous conductive paths separated by a non-conductive layer, thus forming the LC network.

Since the LC network according to the present invention is entirely formed by simple cutting and laminating operations, its manufacturing cost is kept desirably low.

BRIEF DESCRIPTION OF THE DRAWING

The present invention will be further described hereinafter with reference to the accompanying drawing wherein.

DETAILED DESCRIPTION OF THE PREFERRED EMBODIMENTS

Figure 2:
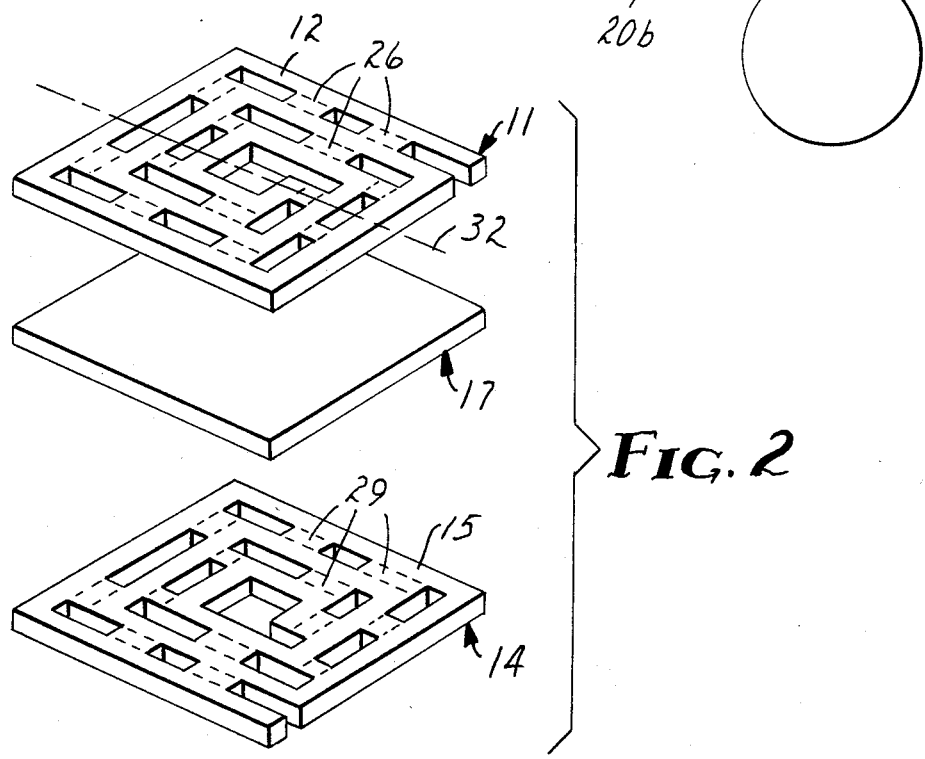
FIG. 2 is an exploded view of the various layers of a lamination formed during the manufacture of the LC network according to the present invention.
Figure 3:
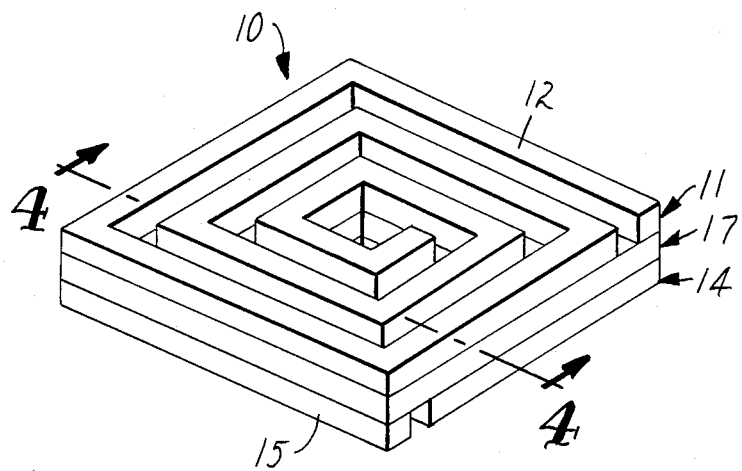
FIG. 3 is a perspective view of the LC network according to the present invention.
Figure 4:
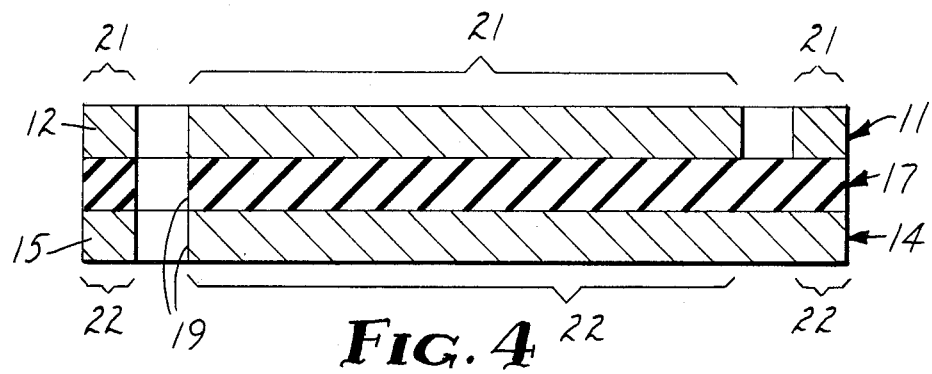
FIG. 4 is a transverse sectional view taken along line 4-4 of FIG. 3.

An LC network 10 according to the present invention is illustrated in FIG. 3. This network 10 comprises a lamination having a first conductive layer 11 including a conductive path 12 which has multiple windings forming an inductor, and a second conductive layer 14 including a conductive path 15 which has multiple windings forming a second inductor. The conductive paths 12 and 15 are typically die cut or punched from sheets of aluminum or copper foil as will be explained. In the embodiment described, the multiple windings forming the conductive paths 12 and 15 consist of rectangular shaped legs which spiral inwardly in a rectangular pattern. The conductive layers 11 and 14 are separated by a non-conductive layer 17 therebetween. This non-conductive layer 17 serves as a dielectric for the LC network, as will also be described. As a result of the method of manufacturing this lamination, all three of the layers, 11, 14, and 17, forming the lamination, have a configuration of voids 19 therethrough which are disposed between the adjacent windings of the conductive paths 12 and 15. These voids 19 are created as the result of removing certain structural interconnections 26 and 29 (see FIG. 2) which exist between the conductive paths 12 and 15 prior to their lamination to the non-conductive layer 17. The conductive layers 11 and 14 are positioned on the non-conductive layer 17 such that at least one area 21 (see FIG. 4) of the conductive path 12 is in alignment with a corresponding area 22 of the conductive path 15. This disposition or arrangement of the two conductive paths 12 and 15 with respect to each other, separated by the non-conductive layer 17 (now containing voids), introduces the capacitive element of the LC network 10.

Figure 1:
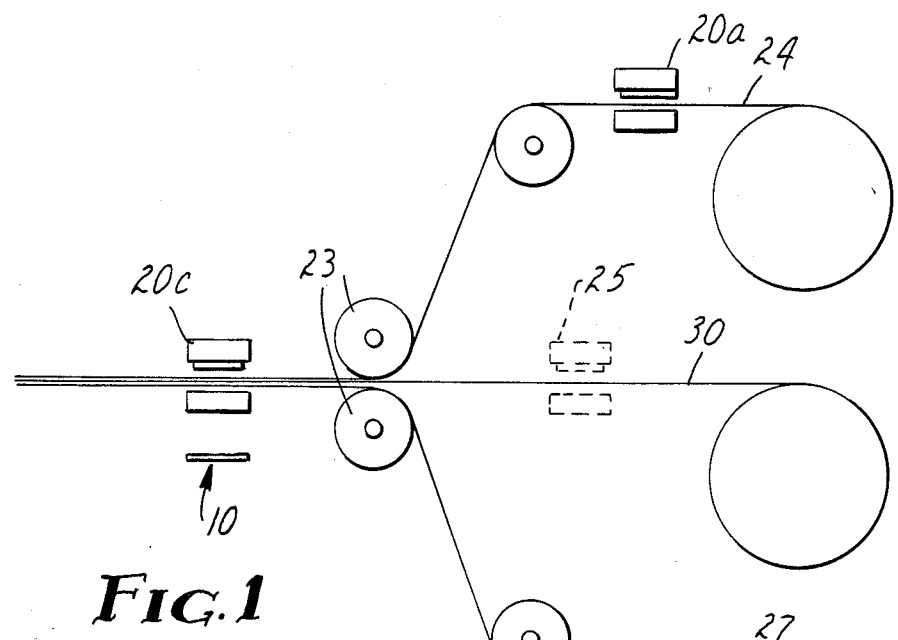
FIG. 1 is an illustration of a method of manufacturing an LC network according to the present invention.

The LC network 10 described above is manufactured by the method of the present invention, which method involves only the simple and conventional operations of die cutting and lamination and which method is adaptable to the automated manufacture of LC networks, and therefore capable of affording a reduction in the cost for these LC networks as compared to the prior art methods of manufacturing LC networks. The method according to the present invention utilizes a conventional die cutting press 20a, 20b, or 20c with its associated male and female dies, and conventional laminating means 23; and comprises (see FIGS. 1 and 2) cutting and removing, a predetermined pattern from a first conductive sheet 24, leaving a conductive path 12 having an essentially coil-like configuration of windings with a plurality of interconnections 26 between the adjacent windings, wherein the conductive sheet 24 remains intact. A predetermined pattern is also cut and removed from a second conductive sheet 27, leaving a conductive path 15 having an essentially coil-like configuration of windings with a plurality of interconnections 29 between the adjacent windings wherein the conductive sheet 27 remains intact. These conductive sheets are typically webs of metallic foils, for example aluminum or copper, which are highly conductive, and which generally have a range of thickness varying from 0.02 millimeters to 0.10 millimeters. The cutting of the conductive sheet 24 or 27 into a coil-like configuration having the interconnections 26 and 29, allows the conductive sheet to remain essentially self-supporting, i.e. tending to remain in a planar state, thus facilitating the laminating process. Without the added rigidity due to these interconnections 26 and 29, the inherent tendency of the coil-like configuration to telescope, i.e. vary from a generally planar state, would potentially cause difficulty in the remainder of the manufacturing steps. After the predetermined pattern has been removed from the two conductive sheets 24 and 27, these sheets are laminated to opposing faces of a non-conductive sheet 30. Typically, the non-conductive sheet is cut from a web of polypropylene which web has a thickness in the range of from 0.02 to 0.10 millimeters. Other non-conductive materials may be utilized providing they afford the dielectric characteristics required for capacitive elements as has been described. Similarly, depending upon the resonant frequency or time constant required for the LC network 10, other sheet thicknesses may be utilized for the non-conductive sheet 30. Prior to laminating the conductive sheets 24 and 27 to the non-conductive sheets 30, the conductive sheets 24 and 27 are oriented such that the conductive path 12 is substantially aligned with the conductive path 15. The presence of the aligned conductive paths 12 and 15, as separated by the non-conductive sheet 30, will introduce the capacitance between the conductive sheets 24 and 27.

The lamination formed by the above steps is then further diecut to eliminate the interconnections 26 and 29 left between the conductive paths 12 and 15 by the original cutting operation performed on the conductive sheets 24 and 27. At this time the conductive sheets 24 and 27, and the non-conductive sheets 30 are also die cut into the rectangular shape which is the final form of the LC network 10. It should be noted, however, that it is also possible to die cut the rectangular layers 11, 14, and 17 directly from the sheets 24, 27 and 30 prior to their lamination. For this reason another die cutting station 25 is shown in phantom in FIG. 1. This direct cutting of the layers 11, 14, and 17 offers some advantage since, as can be seen from FIG. 2, the conductive sheets 24 and 27 are similar to each other, the only difference being that one has its windings spiraling inwardly in a counterclockwise direction, while the other has its windings spiraling inwardly in a clockwise direction. Hence a conductive sheet having the configuration of conductive sheet 24 can be used as the conductive sheet 27 merely by rotating the conductive sheet 180 degrees about an axis 32 parallel to the first leg of its outer winding. When the interconnections 26 and 29 are removed, a continuous conductive path 12 or 15 in a configuration of a coil having mulitple windings therein, remains on each of the conductive layers 11 and 14. These coils form the inductances for the LC network 10. Since the conductive layers 11 and 14 are laminated to the non-conductive layer 17, there is sufficient strength for the lamination to be self-supporting even without the interconnections 26. Hence, the removal of the interconnections 26 and 29 at this stage does not introduce a handling problem as was the case with the individual conductive sheets 24 and 27.

Having thus described a preferred embodiment of the present invention, it will be understood that changes may be made in size, shape, or configuration of some of the parts or circuits described herein without departing from the present invention as recited in the appended claims.

What is claimed is:

1. A method of constructing an LC network comprising, cutting and removing a predetermined pattern from a first conductive sheet, leaving a conductive path having an essentially coil-like configuration of windings with a plurality of interconnections between the adjacent windings of the configuration, which interconnections add rigidity to the conductive sheet, cutting and removing a predetermined pattern from a second conductive sheet, leaving a conductive path having as essentially coil-like configuration of windings with a plurality of interconnections between the adjacent windings of the configuration, which interconnections also add rigidity to the second conductive sheet, forming at least one capacitor by orienting the first and second conductive sheets with respect to each other and laminating these conductive sheets to opposing faces of a non-conductive sheet with at least one portion of the conductive paths on the first conductive sheet substantially aligned with at least one portion of the conductive paths on the second conductive sheet, but with the aligned portions separated from each other by the non-conductive sheet, and, cutting from the lamination formed by said above steps to eliminate at least some of the interconnections between the adjacent spirals on each of the conductive sheets, and leaving at least one continuous portion of the conductive path on the conductive sheets which is in the configuration of a coil and in which the adjacent windings are no longer interconnected.

2. A method of constructing an LC network according to claim 1, comprising cutting and removing two identical said predetermined patterns from different portions of a longitudinal web of conductive material, separating said different portions from the web to provide said first and second conductive sheets having said interconnected coil-like configuration therein, and rotating one of said separated sheets 180 degrees with respect to an axis parallel with one leg of its outer winding prior to laminating said sheets to said non-conductive sheet.

3. A method of constructing a substantially planar multi-turn inductor comprising:

(a) applying a first cutting means to a conductive sheet to cut therefrom a first discontinuous predetermined pattern, forming therein a multi-turn, essentially spiral-like configuration, having a plurality of interconnecting regions between adjacent turns of the spiral-like configuration, which interconnecting regions add rigidity to the thus configured sheet, (b) laminating one surface of the configured sheet to a surface of a sheet of dielectric material, and (c) applying a second cutting means to the laminate formed via the preceeding step to cut therefrom another discontinuous predetermined pattern which includes most of the interconnecting regions between the adjacent turns of the first discontinuous pattern, leaving in the configured conductive sheet at least one continuous portions of the spiral-like configuration with no interconnecting regions to thereby complete said multi-turn inductor.

4. A method according to claim 3, comprising:

(d) applying a cutting means to a second conductive sheet to cut therefrom another discontinuous predetermined pattern, forming therein another multi-turn essentially spiral-like configuration having a plurality of interconnecting regions between adjacent turns of the spiral-like configuration, which interconnecting regions also add rigidity to the thus configured second sheet forming at least one capacitor by orienting the first and second conductive sheets with respect to each other and laminating these conductive sheets to opposing faces of said sheet of dielectric material with at least one portion of the conductive paths on the first conductive sheet substantially aligned with at least one portion of the conductive paths on the second conductive sheet, but with the aligned portions separated from each other by the dielectric sheet, and, applying said cutting means to the capacitive lamination formed by said above steps, thereby eliminating at least some of the interconnections between the adjacent spirals on each of the conductive sheets, and leaving at least one continuous portion of the conductive path on the conductive sheets which is in the configuration of a coil and in which the adjacent windings are no longer interconnected to thereby form an inductive-capacitive (LC) network.

5. A method of constructing an LC network according to claim 4, comprising cutting and removing two identical said predetermined patterns from different portions of a longitudinal web of conductive material, separating said different portions from the web to provide said first and second conductive sheets having said interconnected coil-like configuration therein, and rotating one of said separated sheets 180 degrees with respect to an axis parallel with one leg of its outer winding prior to laminating said sheets to said nonconductive sheet.

* * * * *